(12) United States Patent
Bremicker et al.

(10) Patent No.: US 7,715,195 B2
(45) Date of Patent: May 11, 2010

(54) INVERTER CASING

(75) Inventors: Sven Bremicker, Alheim (DE); Andreas Donth, Edermünde (DE); Stefan Domagala, Rzaska (PL)

(73) Assignee: SMA Solar Technology AG., Niestetal (DE)

( * ) Notice: Subject to any disclaimer, the term of this patent is extended or adjusted under 35 U.S.C. 154(b) by 31 days.

(21) Appl. No.: 12/151,461

(22) Filed: May 7, 2008

(65) Prior Publication Data

US 2008/0291632 A1 Nov. 27, 2008

(30) Foreign Application Priority Data

May 25, 2007 (EP) .................................. 07010429

(51) Int. Cl.
H05K 7/20 (2006.01)
(52) U.S. Cl. .................. 361/714; 361/707; 361/709; 361/676; 363/141; 363/144; 174/50; 174/52.1; 312/223.2
(58) Field of Classification Search .................. 361/603, 361/620, 641, 676, 678, 679, 714; 363/31, 363/40, 41, 55, 131, 141, 142, 144, 146; 337/186; 312/223.2, 223.3, 236; 174/50, 174/52.1, 52.4, 35 R, 58, 7, 49; D13/110, D13/123, 184, 199
See application file for complete search history.

(56) References Cited

U.S. PATENT DOCUMENTS

| 4,015,173 A | * | 3/1977 | Nitsche | 361/709 |
| 4,620,263 A | * | 10/1986 | Ito | 361/690 |
| 4,872,102 A | * | 10/1989 | Getter | 363/141 |
| 4,908,734 A | * | 3/1990 | Fujioka | 361/703 |
| 5,012,173 A | * | 4/1991 | Fujioka et al. | 318/727 |
| 5,091,823 A | * | 2/1992 | Kanbara et al. | 361/697 |
| 5,170,336 A | * | 12/1992 | Getter et al. | 363/141 |
| 5,373,418 A | * | 12/1994 | Hayasi | 361/707 |
| 5,497,289 A | * | 3/1996 | Sugishima et al. | 361/709 |
| 5,940,272 A | * | 8/1999 | Emori et al. | 361/704 |
| 6,152,699 A | * | 11/2000 | Shikata et al. | 417/12 |
| 7,042,745 B1 | * | 5/2006 | Chen | 363/144 |
| 7,310,233 B2 | * | 12/2007 | Bell | 361/704 |
| D562,765 S | * | 2/2008 | Tsuzuki et al. | D13/110 |
| 7,397,653 B2 | * | 7/2008 | Taylor | 361/676 |
| 7,463,489 B2 | * | 12/2008 | Falk et al. | 361/719 |
| D593,030 S | * | 5/2009 | Konoma et al. | D13/110 |
| 2004/0226761 A1 | | 11/2004 | Takenaka et al. | |

FOREIGN PATENT DOCUMENTS

| DE | 9320825 U1 | 2/1995 |
| DE | 10151928 A1 | 7/2002 |
| EP | 1848260 A | 10/2007 |
| JP | 10227489 A | 8/1998 |

* cited by examiner

Primary Examiner—Michael V Datskovskiy
(74) Attorney, Agent, or Firm—Thomas R. Vigil

(57) ABSTRACT

The invention relates to an inverter casing, said inverter casing comprising in the bottom at least one depression for receiving heat dissipating electric components, coils in particular.

16 Claims, 2 Drawing Sheets

INVERTER CASING

CROSS-REFERENCE TO RELATED APPLICATIONS

This application claims Priority from European Application No. EP 07010429.4 filed on May 25, 2007

BACKGROUND OF THE INVENTION

1. Field of the Invention

The invention relates to an inverter casing.

In the exploitation of energy sources such as PV modules, inverters serve to convert direct current into alternating current. Such an inverter comprises a casing housing electronic power components. These electronic power components comprise, inter alia, components that radiate considerable heat during operation. These components are coils such as chokes in particular.

2. Description of the Prior Art

In this context, a drive unit is known from US 2004/226761 A1, said drive unit comprising a motor, a generator and a gear that are accommodated in a housing, another casing being provided thereon for housing the inverter. The problem of the coils in the inverter radiating heat onto other electric power components of the inverter is not discussed therein.

It is further known that the electronic power components must be protected against environmental impact and in this case more specifically against humidity. Accordingly, casings accommodating such electronic power components have at least the IP65 rating.

On the other hand, it is also known that, through the considerable heat radiation of such coils for example when such type components are mounted in the casing of an inverter, reliability and lifetime of the equipment suffer considerably. A casing accommodating both the electronic power components and in particular coils tries to overcome this problem by separating such coils from printed circuit boards for example through radiation sheets, the function of which consists in preventing as far as possible said coils from directly radiating heat to the printed circuit board. It is thus achieved that the printed circuit board is not subjected directly to the heat radiation, of the coil for example, meaning of a choke for instance. It is however obvious that with such a configuration of an inverter casing the temperature within the casing rises to a constant high value quite shortly after beginning of operation, this being little beneficial to the life time of such an inverter.

In this context, it is known from DE 10 2004 030 457 A1 to accommodate coils outside of the actual casing for the electronic power components. Since the coils need a far lower IP-rating than the typical electronic power components such as printed circuit boards and similar, there is provided to provide the casing part accommodating coils in the form of chokes for example with ventilation slots and at need to also provide for a forced ventilation from the outside through corresponding fans. The advantage of this embodiment is the thermal decoupling of the coils from the other electronic power components in the equipment, so that the temperature inside the casing, meaning in particular in that part of the casing that accommodates the temperature-sensitive electronic power components, can be considerably reduced, this making it possible to considerably increase the lifetime of the equipment and eventually also its reliability.

As already explained above, the electronic power components are to be protected against humidity according to the IP65 rating.

If the chokes for example are accommodated in a special casing part, the connection through the wall to the electronic power components is to be configured so as to meet at least the IP-rating of the casing or casing part accommodating the electronic power components. Another disadvantage is that with this embodiment the coils need to have quite high an IP-rating although they are quite insensitive to humidity. Usually, a separate cover is provided for this casing part accommodating the coils, for the very reason of protecting these coils from UV radiation.

Insofar, it must be noted that, although this construction allows for thermal decoupling between the coils on the one side and the electronic power components on the other side in the casing of an inverter, the expense in terms of construction is still quite high so that an inverter built in this way is expensive.

BRIEF SUMMARY OF THE INVENTION

It is therefore the object of the invention to provide a thermal decoupling between the coils of an inverter and the other electronic power components that are to be protected from heat as far as possible in order to thus increase the lifetime and the reliability of such an inverter, with such an inverter or rather the casing of such an inverter being manufacturable at low cost, with the coils not having to be subjected to a rating of their own and no IP-rating having to be provided with respect to the wiring between the coils and the electronic power components.

In accordance with the invention, this object is achieved in that the inverter casing comprises in the bottom thereof at least one depression for accommodating heat dissipating electric components, in particular coils.

Such a cup- or pot-shaped depression for accommodating the coils, chokes e.g., offers a considerable surface through which the heat generated by the coils can be radiated outward through the bottom of the inverter casing. This is to say that the radiating heat will only be radiated to a small extent into the casing or the casing part accommodating the electronic power components, especially if there is a good heat transfer between the casing and the coil.

In a special embodiment of a casing, there is provided that the casing comprises at least two casing chambers, the first casing chamber accommodating the electronic power components of the inverter, the at least one depression for accommodating heat dissipating electric components, more specifically coils being provided in the bottom of the first casing chamber. It is obvious therefrom that the advantages of accommodating the coils in the depressions belonging to the casing chamber having the higher IP rating may be combined with the advantages obtained from the fact that no special provisions must be made for isolating, e.g., the electric connection, by virtue of the accommodation of both the electronic power components and the coils in one casing.

Advantageous features of the invention will become apparent from the subordinate claims.

There is more specifically provided that the depression may be covered by a partition plate, in this case more specifically a heat insulating partition plate. Through such a heat insulating partition plate, in the form of a sandwich plate in particular, the direct heat radiation of the coil into the casing or casing chamber accommodating the electronic power components is further reduced.

In order to dissipate the heat transferred by the coils to the casing bottom when the inverter is in operation, there is more specifically provided that cooling ribs are provided on the outer side of the depression. Advantageously, the cooling ribs are not only provided on the outer side of the casing in this context, but also to the side of the at least one depression, on the casing bottom. It is obvious therefrom that the entire casing bottom, inclusive of the depressions, is provided with corresponding cooling ribs.

The invention will be best understood from the following description when read in conjunction with the accompanying drawings.

DETAILED DESCRIPTION OF THE INVENTION

Figure 1:
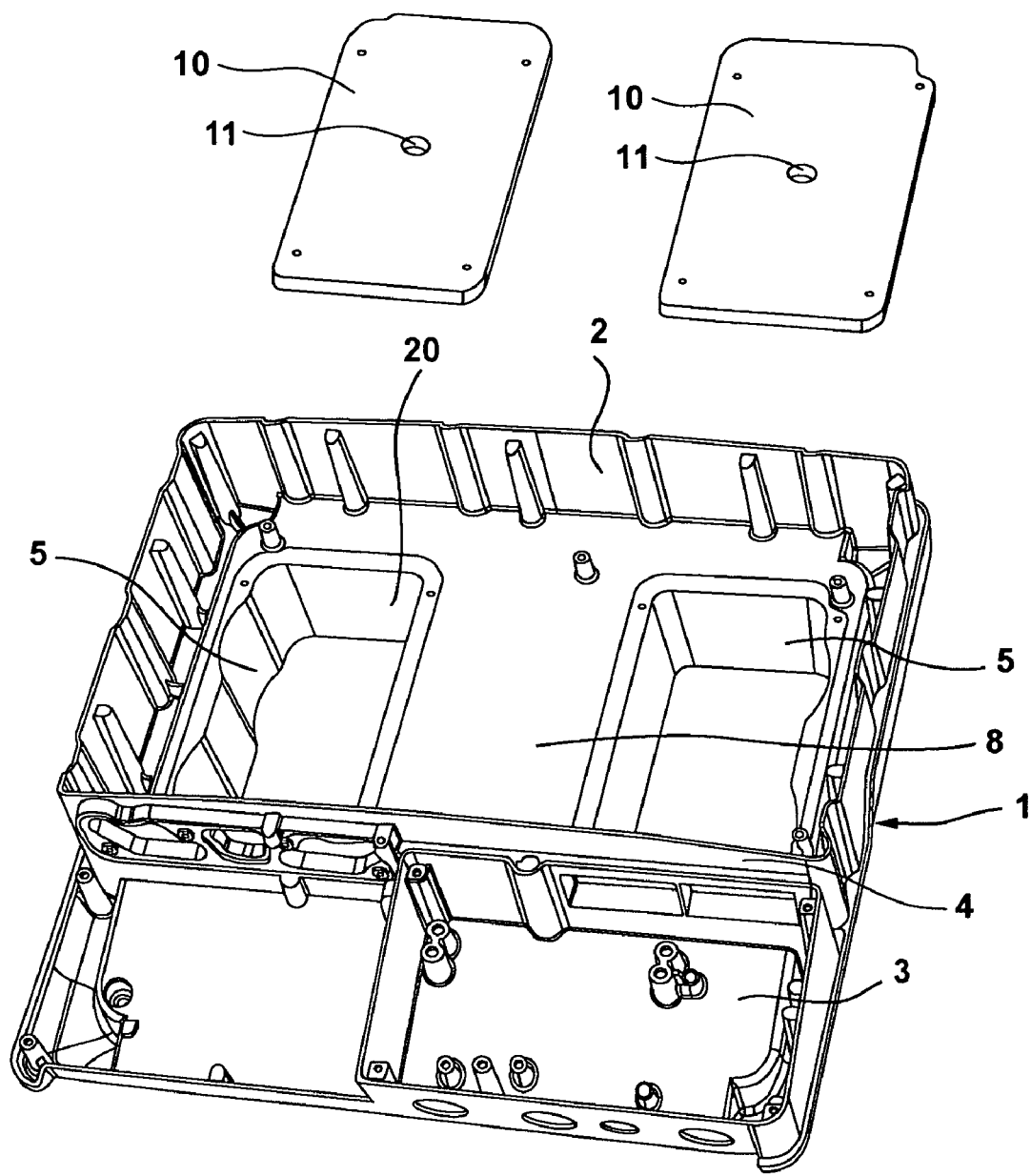
FIG. 1 shows the casing without a cover in a perspective view from the top, the coils in the depressions in the casing bottom being removed.
Figure 2:
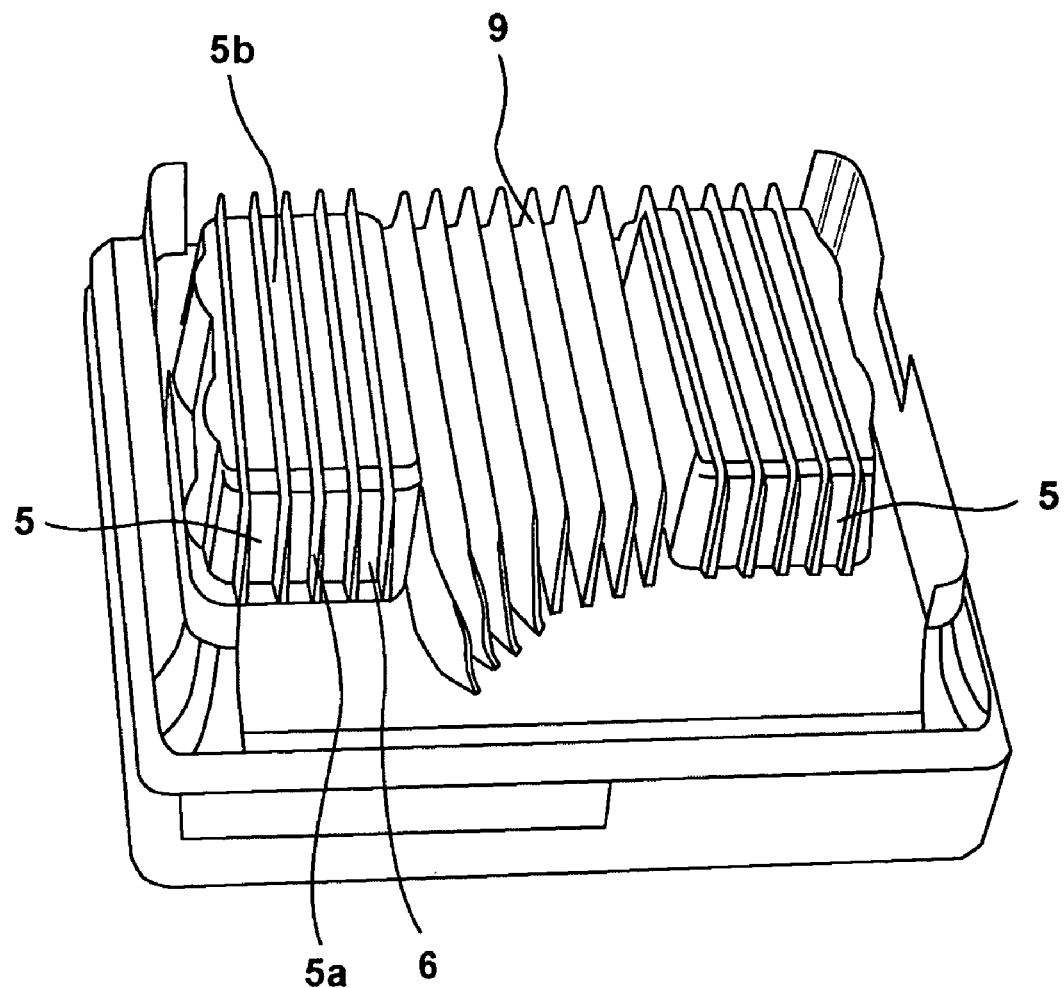
FIG. 2 shows a view from the bottom onto the housing.

The casing, which is indicated generally at 1, has the two casing chambers 2, 3 that are separated from each other by a wall 4. The invention is directed to the configuration of the casing chamber 2. The casing chamber 2 comprises the two depressions indicated at 5 which serve to receive coils, e.g., chokes. After the chokes are lodged in the cup- or pot-like depressions 5, these depressions are closed by partition plates 10 forming a level surface. These partition plates 10 are screwed to the bottom. The partition plates 10 are advantageously built in a sandwich style so that they offer a certain insulating effect. These partition plates 10 have an opening 11 in their center for feeding the cables to the electronic power components that are located on the bottom 8 above the depressions in the casing chamber 2. The casing 1 itself is covered by one or several covers that are not illustrated herein. FIG. 2 shows a view from the bottom onto the casing. The cup-like depressions 5 hereby comprise cooling ribs 6 in the region of their side wall 5a and in the region of the underside 5b of the bottom. Additional cooling ribs 9 are provided between the individual pot- or cup-like depressions.

The following becomes apparent:

The cup- or pot-like depressions 5 for accommodating coils, chokes in particular, are a constituent part of the bottom of the casing or rather of casing chamber 2, thus forming a casing unit that is subjected to one unique IP-rating, namely to the rating IP65. There is still a thermal separation from the electronic power components (not shown) disposed on the bottom 8 and at need also on the partition plates 10 so that the upper part of the housing chamber 2 is heated to a small extent only by the coils in the depressions 5. Especially if the partition plates themselves are configured to be thermally isolating, the heat generated by the coils is substantially directly dissipated to the environment by the depression surrounding them. In particular the cooling ribs 6 located directly on the outer side of the depressions but also the additional cooling ribs 9 disposed between the depressions serve this purpose.

We claim:

1. An inverter comprising a casing with at least two casing chambers, a first casing chamber accommodating power components of the inverter and wherein at least one depression for receiving heat dissipating electric components is provided in a bottom of the first casing chamber and the depression is covered by a partition plate.

2. The inverter as set forth in claim 1, wherein the partition plate is configured to be heat insulating.

3. The inverter as set forth in claim 1, wherein the casing further comprises cooling ribs on the outer side of the depression.

4. The inverter as set forth in claim 3, wherein the cooling ribs are disposed to the side of the depression on the outer side of the casing bottom.

5. The inverter a set forth in claim 1 wherein the heat dissipating electric components comprise a coil.

6. An inverter comprising a casing with at least one depression for receiving heat dissipating electric components in a bottom of the casing and wherein the depression is covered by a partition plate.

7. The inverter a set forth in claim 6, wherein the partition plate is configured to be heat insulating.

8. The inverter as set forth in claim 6, wherein the casing further comprises cooling ribs on the outer side of the depression.

9. The inverter as set forth in claim 8, wherein the cooling ribs are disposed to the side of the depression on the outer side of the casing bottom.

10. The inverter as set forth in claim 6 wherein the heat dissipating electric components comprise a coil.

11. The inverter as set forth in claim 6 wherein the casing comprises a first casing chamber and a second casing chamber, the first casing chamber accommodating power components of the inverter, the depression being provided in a bottom of the first chamber.

12. An inverter comprising a casing with at least one depression for receiving heat dissipating electric components in a bottom of the casing and wherein cooling ribs are disposed on the outer side of the depression and the depression is covered by a partition plate.

13. The inverter as set forth in claim 12, wherein the partition plate is configured to be heat insulating.

14. The inverter easing as set forth in claim 12, wherein the cooling ribs are disposed to the side of the depression on the outer side of the casing bottom.

15. The inverter as set forth in claim 12 wherein the heat dissipating electric components comprise a coil.

16. The inverter as set forth in claim 12 wherein the casing comprises a first casing chamber and a second casing chamber, the first casing chamber accommodating power components of the inverter, the depression being provided in a bottom of the first chamber.

\* \* \* \* \*